United States Patent
Schneider

(10) Patent No.: US 8,217,810 B2
(45) Date of Patent: Jul. 10, 2012

(54) MEMORY MANAGEMENT FOR PREDICTION BY PARTIAL MATCHING CONTEXT MODELS

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 975 days.

(21) Appl. No.: 12/200,714

(22) Filed: Aug. 28, 2008

(65) Prior Publication Data

US 2010/0058348 A1    Mar. 4, 2010

(51) Int. Cl.
 *H03M 7/34* (2006.01)
(52) U.S. Cl. .................. 341/51; 341/50; 341/87
(58) Field of Classification Search ............ 341/51, 341/87

See application file for complete search history.

(56) References Cited

U.S. PATENT DOCUMENTS 6,037,883 A * 3/2000 Forbes ............................ 341/51
7,623,047 B2 * 11/2009 Ordentlich et al. ............. 341/51

* cited by examiner

*Primary Examiner* — Khai M Nguyen
(74) *Attorney, Agent, or Firm* — Lowenstein Sandler PC

(57) ABSTRACT

Techniques for resource management of a PPM context model are described herein. According to one embodiment, in response to a sequence of symbols to be coded, contexts are allocated, each having multiple entries and each entry representing a symbol that the current context is able to encode, including a counter value representing a frequency of each entry being used. For each symbol coded by a context, a local counter value and a global counter value are maintained. The global counter value represents a total number of symbols that have been coded by the context model and the local counter value represents a number symbols that have been coded by the respective context. Thereafter, a resource management operation is performed for system resources associated with the plurality of contexts based on a global counter value and a local counter value associated with each of the plurality of contexts.

24 Claims, 18 Drawing Sheets

```
struct Context_Structure
{
    int     Local_Count_Value;
    int     Global_Count_Value;
    void    *Child_Pointer[256];
    int     Count_Value[257];
    void    *Preceding_Shorter_Context_Pointer;
}
```

FIG. 3

| "" Context Table | | |
|---|---|---|
| Symbol | Count | Pointer |
| <Esc> | 0 | |
| | | |
| | | |
| | | |
| Local/Global Count | | |

FIG. 6A

| "a" Context Table | | |
|---|---|---|
| Symbol | Count | Pointer |
| <Esc> | 1 | "" |
| | | |
| | | |
| | | |
| Local/Global Count | | 1/1 |

| "" Context Table | | |
|---|---|---|
| Symbol | Count | Pointer |
| <Esc> | 1 | |
| a | 1 | a |
| | | |
| | | |
| Local/Global Count | | |

FIG. 6B

"" Context Table

| Symbol | Count | Pointer |
|---|---|---|
| <Esc> | 1 | |
| a | 1 | a |
| b | 1 | b |
| Local/Global Count | | |

"a" Context Table

| Symbol | Count | Pointer |
|---|---|---|
| <Esc> | 1 | "" |
| b | 1 | ab |
| Local/Global Count | 2/2 | |

"b" Context Table

| Symbol | Count | Pointer |
|---|---|---|
| <Esc> | 1 | "" |
| Local/Global Count | 1/2 | |

"ab" Context Table

| Symbol | Count | Pointer |
|---|---|---|
| <Esc> | 1 | "" |
| Local/Global Count | 1/2 | |

"" Context Table

| Symbol | Count | Pointer |
|---|---|---|
| \<Esc\> | 1 | |
| a | 1 | a |
| b | 1 | b |
| r | 1 | r |
| | | |
| Local/Global Count | | |

"a" Context Table

| Symbol | Count | Pointer |
|---|---|---|
| \<Esc\> | 1 | "" |
| b | 1 | ab |
| | | |
| Local/Global Count | 2/2 | |

"b" Context Table

| Symbol | Count | Pointer |
|---|---|---|
| \<Esc\> | 1 | "" |
| r | 1 | br |
| | | |
| Local/Global Count | 2/3 | |

"ab" Context Table

| Symbol | Count | Pointer |
|---|---|---|
| \<Esc\> | 1 | "" |
| r | 1 | br |
| | | |
| Local/Global Count | 2/3 | |

"r" Context Table

| Symbol | Count | Pointer |
|---|---|---|
| \<Esc\> | 1 | "" |
| | | |
| Local/Global Count | 1/3 | |

"br" Context Table

| Symbol | Count | Pointer |
|---|---|---|
| \<Esc\> | 1 | "" |
| | | |
| Local/Global Count | 1/3 | |

"" Context Table

| Symbol | Count | Pointer |
|---|---|---|
| \<Esc\> | 1 | |
| a | 2 | a |
| b | 1 | b |
| r | 1 | r |

Local/Global Count

"a" Context Table

| Symbol | Count | Pointer |
|---|---|---|
| \<Esc\> | 1 | "" |
| b | 1 | ab |

Local/Global Count 2/2

"b" Context Table

| Symbol | Count | Pointer |
|---|---|---|
| \<Esc\> | 1 | "" |
| r | 1 | br |

Local/Global Count 2/3

"ab" Context Table

| Symbol | Count | Pointer |
|---|---|---|
| \<Esc\> | 1 | "" |
| r | 1 | br |

Local/Global Count 2/3

"r" Context Table

| Symbol | Count | Pointer |
|---|---|---|
| \<Esc\> | 1 | "" |
| a | 1 | ra |

Local/Global Count 2/4

"br" Context Table

| Symbol | Count | Pointer |
|---|---|---|
| \<Esc\> | 1 | "" |
| a | 1 | ra |

Local/Global Count 2/4

"ra" Context Table

| Symbol | Count | Pointer |
|---|---|---|
| \<Esc\> | 1 | "" |

Local/Global Count 1/4

FIG. 6E

| "" Context Table | | |
|---|---|---|
| Symbol | Count | Pointer |
| <Esc> | 1 | |
| a | 2 | a |
| b | 1 | b |
| r | 1 | r |
| c | 1 | c |
| Local/Global Count | | |

| "a" Context Table | | |
|---|---|---|
| Symbol | Count | Pointer |
| <Esc> | 1 | "" |
| b | 1 | ab |
| c | 1 | ac |
| Local/Global Count | 3/5 | |

| "b" Context Table | | |
|---|---|---|
| Symbol | Count | Pointer |
| <Esc> | 1 | "" |
| r | 1 | br |
| Local/Global Count | 2/3 | |

| "ab" Context Table | | |
|---|---|---|
| Symbol | Count | Pointer |
| <Esc> | 1 | b |
| r | 1 | br |
| Local/Global Count | 2/3 | |

| "r" Context Table | | |
|---|---|---|
| Symbol | Count | Pointer |
| <Esc> | 1 | "" |
| a | 1 | ra |
| Local/Global Count | 2/4 | |

| "br" Context Table | | |
|---|---|---|
| Symbol | Count | Pointer |
| <Esc> | 1 | r |
| a | 1 | ra |
| Local/Global Count | 2/4 | |

| "ra" Context Table | | |
|---|---|---|
| Symbol | Count | Pointer |
| <Esc> | 1 | a |
| c | 1 | ac |
| Local/Global Count | 2/5 | |

| "c" Context Table | | |
|---|---|---|
| Symbol | Count | Pointer |
| <Esc> | 1 | "" |
| Local/Global Count | 1/5 | |

| "ac" Context Table | | |
|---|---|---|
| Symbol | Count | Pointer |
| <Esc> | 1 | c |
| Local/Global Count | 1/5 | |

FIG. 6F

"" Context Table

| Symbol | Count | Pointer |
|---|---|---|
| <Esc> | 1 | |
| a | 3 | a |
| b | 1 | b |
| r | 1 | r |
| c | 1 | c |
| Local/Global Count | | |

"a" Context Table

| Symbol | Count | Pointer |
|---|---|---|
| <Esc> | 1 | "" |
| b | 1 | ab |
| c | 1 | ac |
| Local/Global Count | 3/5 | |

"b" Context Table

| Symbol | Count | Pointer |
|---|---|---|
| <Esc> | 1 | "" |
| r | 1 | br |
| Local/Global Count | 2/3 | |

"ab" Context Table

| Symbol | Count | Pointer |
|---|---|---|
| <Esc> | 1 | b |
| r | 1 | br |
| Local/Global Count | 2/3 | |

"r" Context Table

| Symbol | Count | Pointer |
|---|---|---|
| <Esc> | 1 | "" |
| a | 1 | ra |
| Local/Global Count | 2/4 | |

"br" Context Table

| Symbol | Count | Pointer |
|---|---|---|
| <Esc> | 1 | r |
| a | 1 | ra |
| Local/Global Count | 2/4 | |

"ra" Context Table

| Symbol | Count | Pointer |
|---|---|---|
| <Esc> | 1 | a |
| c | 1 | ac |
| Local/Global Count | 2/5 | |

"c" Context Table

| Symbol | Count | Pointer |
|---|---|---|
| <Esc> | 1 | "" |
| a | 1 | ca |
| Local/Global Count | 2/6 | |

"ac" Context Table

| Symbol | Count | Pointer |
|---|---|---|
| <Esc> | 1 | c |
| a | 1 | ca |
| Local/Global Count | 2/6 | |

"ca" Context Table

| Symbol | Count | Pointer |
|---|---|---|
| <Esc> | 1 | a |
| Local/Global Count | 1/6 | |

FIG. 6G

| "" Context Table | | |
|---|---|---|
| Symbol | Count | Pointer |
| <Esc> | 1 | |
| a | 3 | a |
| b | 1 | b |
| r | 1 | r |
| c | 1 | c |
| d | 1 | d |
| Local/Global Count | | |

| "a" Context Table | | |
|---|---|---|
| Symbol | Count | Pointer |
| <Esc> | 1 | "" |
| b | 1 | ab |
| c | 1 | ac |
| d | 1 | ad |
| Local/Global Count | 4/7 | |

| "ab" Context Table | | |
|---|---|---|
| Symbol | Count | Pointer |
| <Esc> | 1 | b |
| r | 1 | br |
| Local/Global Count | 2/3 | |

| "r" Context Table | | |
|---|---|---|
| Symbol | Count | Pointer |
| <Esc> | 1 | "" |
| a | 1 | ra |
| Local/Global Count | 2/4 | |

| "br" Context Table | | |
|---|---|---|
| Symbol | Count | Pointer |
| <Esc> | 1 | r |
| a | 1 | ra |
| Local/Global Count | 2/4 | |

| "b" Context Table | | |
|---|---|---|
| Symbol | Count | Pointer |
| <Esc> | 1 | "" |
| r | 1 | br |
| Local/Global Count | 2/3 | |

| "ra" Context Table | | |
|---|---|---|
| Symbol | Count | Pointer |
| <Esc> | 1 | a |
| c | 1 | ac |
| Local/Global Count | 2/5 | |

| "c" Context Table | | |
|---|---|---|
| Symbol | Count | Pointer |
| <Esc> | 1 | "" |
| a | 1 | ca |
| Local/Global Count | 2/6 | |

| "ac" Context Table | | |
|---|---|---|
| Symbol | Count | Pointer |
| <Esc> | 1 | c |
| a | 1 | ca |
| Local/Global Count | 2/6 | |

| "ca" Context Table | | |
|---|---|---|
| Symbol | Count | Pointer |
| <Esc> | 1 | a |
| d | 1 | ad |
| Local/Global Count | 2/7 | |

| "d" Context Table | | |
|---|---|---|
| Symbol | Count | Pointer |
| <Esc> | 1 | "" |
| Local/Global Count | 1/7 | |

| "ad" Context Table | | |
|---|---|---|
| Symbol | Count | Pointer |
| <Esc> | 1 | d |
| Local/Global Count | 1/7 | |

FIG. 6H

| "" Context Table | | |
|---|---|---|
| Symbol | Count | Pointer |
| <Esc> | 1 | |
| a | 4 | a |
| b | 1 | b |
| r | 1 | r |
| c | 1 | c |
| d | 1 | d |
| Local/Global Count | 2/4 | |

| "a" Context Table | | |
|---|---|---|
| Symbol | Count | Pointer |
| <Esc> | 1 | "" |
| b | 1 | ab |
| c | 1 | ac |
| d | 1 | ad |
| Local/Global Count | 4/7 | |

| "b" Context Table | | |
|---|---|---|
| Symbol | Count | Pointer |
| <Esc> | 1 | "" |
| r | 1 | br |
| Local/Global Count | 2/3 | |

| "ab" Context Table | | |
|---|---|---|
| Symbol | Count | Pointer |
| <Esc> | 1 | b |
| r | 1 | br |
| Local/Global Count | 2/3 | |

| "br" Context Table | | |
|---|---|---|
| Symbol | Count | Pointer |
| <Esc> | 1 | r |
| a | 1 | ra |
| Local/Global Count | 2/4 | |

| "ra" Context Table | | |
|---|---|---|
| Symbol | Count | Pointer |
| <Esc> | 1 | a |
| c | 1 | ac |
| Local/Global Count | 2/5 | |

| "c" Context Table | | |
|---|---|---|
| Symbol | Count | Pointer |
| <Esc> | 1 | "" |
| a | 1 | ca |
| Local/Global Count | 2/6 | |

| "ac" Context Table | | |
|---|---|---|
| Symbol | Count | Pointer |
| <Esc> | 1 | c |
| a | 1 | ca |
| Local/Global Count | 2/6 | |

| "ca" Context Table | | |
|---|---|---|
| Symbol | Count | Pointer |
| <Esc> | 1 | a |
| d | 1 | ad |
| Local/Global Count | 2/7 | |

| "d" Context Table | | |
|---|---|---|
| Symbol | Count | Pointer |
| <Esc> | 1 | "" |
| a | 1 | da |
| Local/Global Count | 2/8 | |

| "ad" Context Table | | |
|---|---|---|
| Symbol | Count | Pointer |
| <Esc> | 1 | d |
| a | 1 | da |
| Local/Global Count | 2/8 | |

| "da" Context Table | | |
|---|---|---|
| Symbol | Count | Pointer |
| <Esc> | 1 | a |
| Local/Global Count | 1/8 | |

FIG. 6I

"" Context Table

| Symbol | Count | Pointer |
|---|---|---|
| <Esc> | 1 | |
| a | 4 | a |
| b | 1 | b |
| r | 1 | r |
| c | 1 | c |
| d | 1 | d |
| Local/Global Count | | |

"a" Context Table

| Symbol | Count | Pointer |
|---|---|---|
| <Esc> | 1 | "" |
| b | 2 | ab |
| c | 1 | ac |
| d | 1 | ad |
| Local/Global Count | 5/9 | |

"ab" Context Table

| Symbol | Count | Pointer |
|---|---|---|
| <Esc> | 1 | b |
| r | 1 | br |
| Local/Global Count | 2/3 | |

"b" Context Table

| Symbol | Count | Pointer |
|---|---|---|
| <Esc> | 1 | "" |
| r | 1 | br |
| Local/Global Count | 2/3 | |

"r" Context Table

| Symbol | Count | Pointer |
|---|---|---|
| <Esc> | 1 | "" |
| a | 1 | ra |
| Local/Global Count | 2/4 | |

"br" Context Table

| Symbol | Count | Pointer |
|---|---|---|
| <Esc> | 1 | r |
| a | 1 | ra |
| Local/Global Count | 2/4 | |

"ra" Context Table

| Symbol | Count | Pointer |
|---|---|---|
| <Esc> | 1 | a |
| c | 1 | ac |
| Local/Global Count | 2/5 | |

"c" Context Table

| Symbol | Count | Pointer |
|---|---|---|
| <Esc> | 1 | "" |
| a | 1 | ca |
| Local/Global Count | 2/6 | |

"ac" Context Table

| Symbol | Count | Pointer |
|---|---|---|
| <Esc> | 1 | c |
| a | 1 | ca |
| Local/Global Count | 2/6 | |

"ca" Context Table

| Symbol | Count | Pointer |
|---|---|---|
| <Esc> | 1 | a |
| d | 1 | ad |
| Local/Global Count | 2/7 | |

"d" Context Table

| Symbol | Count | Pointer |
|---|---|---|
| <Esc> | 1 | "" |
| a | 1 | da |
| Local/Global Count | 2/8 | |

"ad" Context Table

| Symbol | Count | Pointer |
|---|---|---|
| <Esc> | 1 | d |
| a | 1 | da |
| Local/Global Count | 2/8 | |

"da" Context Table

| Symbol | Count | Pointer |
|---|---|---|
| <Esc> | 1 | a |
| | | ab |
| Local/Global Count | 2/9 | |

FIG. 6J

"" Context Table

| Symbol | Count | Pointer |
|---|---|---|
| <Esc> | 1 | |
| a | 4 | a |
| b | 1 | b |
| r | 1 | r |
| c | 1 | c |
| d | 1 | d |
| Local/Global Count | | 2/4 |

"a" Context Table

| Symbol | Count | Pointer |
|---|---|---|
| <Esc> | 1 | "" |
| b | 2 | ab |
| c | 1 | ac |
| d | 1 | ad |
| Local/Global Count | | 5/9 |

"ab" Context Table

| Symbol | Count | Pointer |
|---|---|---|
| <Esc> | 1 | b |
| r | 2 | br |
| Local/Global Count | | 3/10 |

"r" Context Table

| Symbol | Count | Pointer |
|---|---|---|
| <Esc> | 1 | "" |
| a | 1 | ra |
| Local/Global Count | | 2/4 |

"br" Context Table

| Symbol | Count | Pointer |
|---|---|---|
| <Esc> | 1 | r |
| a | 1 | ra |
| Local/Global Count | | 2/3 |

"b" Context Table

| Symbol | Count | Pointer |
|---|---|---|
| <Esc> | 1 | "" |
| r | 1 | br |
| Local/Global Count | | 2/3 |

"ra" Context Table

| Symbol | Count | Pointer |
|---|---|---|
| <Esc> | 1 | a |
| c | 1 | ac |
| Local/Global Count | | 2/5 |

"c" Context Table

| Symbol | Count | Pointer |
|---|---|---|
| <Esc> | 1 | "" |
| a | 1 | ca |
| Local/Global Count | | 2/6 |

"ac" Context Table

| Symbol | Count | Pointer |
|---|---|---|
| <Esc> | 1 | c |
| a | 1 | ca |
| Local/Global Count | | 2/6 |

"ca" Context Table

| Symbol | Count | Pointer |
|---|---|---|
| <Esc> | 1 | a |
| d | 1 | ad |
| Local/Global Count | | 2/7 |

"d" Context Table

| Symbol | Count | Pointer |
|---|---|---|
| <Esc> | 1 | "" |
| a | 1 | da |
| Local/Global Count | | 2/8 |

"ad" Context Table

| Symbol | Count | Pointer |
|---|---|---|
| <Esc> | 1 | d |
| a | 1 | da |
| Local/Global Count | | 2/8 |

"da" Context Table

| Symbol | Count | Pointer |
|---|---|---|
| <Esc> | 1 | a |
| a | 1 | ab |
| Local/Global Count | | 2/9 |

FIG. 6K

"" Context Table

| Symbol | Count | Pointer |
|---|---|---|
| <Esc> | | |
| a | 4 | a |
| b | 1 | b |
| r | 1 | r |
| c | 1 | c |
| d | 1 | d |
| Local/Global Count | | 2/4 |

"a" Context Table

| Symbol | Count | Pointer |
|---|---|---|
| <Esc> | 1 | "" |
| b | 2 | ab |
| c | 1 | ac |
| d | 1 | ad |
| Local/Global Count | | 5/9 |

"ab" Context Table

| Symbol | Count | Pointer |
|---|---|---|
| <Esc> | 1 | b |
| r | 2 | br |
| Local/Global Count | | 3/10 |

"b" Context Table

| Symbol | Count | Pointer |
|---|---|---|
| <Esc> | 1 | "" |
| r | 1 | br |
| Local/Global Count | | 2/3 |

"r" Context Table

| Symbol | Count | Pointer |
|---|---|---|
| <Esc> | 1 | r |
| a | 2 | ra |
| Local/Global Count | | 3/11 |

"ra" Context Table

| Symbol | Count | Pointer |
|---|---|---|
| <Esc> | 1 | a |
| c | 1 | ac |
| Local/Global Count | | 2/5 |

"c" Context Table

| Symbol | Count | Pointer |
|---|---|---|
| <Esc> | 1 | "" |
| a | 1 | ca |
| Local/Global Count | | 2/6 |

"ac" Context Table

| Symbol | Count | Pointer |
|---|---|---|
| <Esc> | 1 | c |
| a | 1 | ca |
| Local/Global Count | | 2/6 |

"ca" Context Table

| Symbol | Count | Pointer |
|---|---|---|
| <Esc> | 1 | a |
| d | 1 | ad |
| Local/Global Count | | 2/7 |

"d" Context Table

| Symbol | Count | Pointer |
|---|---|---|
| <Esc> | 1 | "" |
| a | 1 | da |
| Local/Global Count | | 2/8 |

"ad" Context Table

| Symbol | Count | Pointer |
|---|---|---|
| <Esc> | 1 | d |
| a | 1 | da |
| Local/Global Count | | 2/8 |

"da" Context Table

| Symbol | Count | Pointer |
|---|---|---|
| <Esc> | 1 | a |
| a | 1 | ab |
| Local/Global Count | | 2/9 |

FIG. 6L

MEMORY MANAGEMENT FOR PREDICTION BY PARTIAL MATCHING CONTEXT MODELS

TECHNICAL FIELD

The present invention relates generally to data coding. More particularly, this invention relates to memory management for prediction by partial matching context models.

BACKGROUND

Traditional entropy encoding coding algorithms (such as Huffman coding, adaptive Huffman coding or range coding) can normally be improved by preprocessing their input using a technique designed to enhance the statistical features used by the compression algorithm to achieve coding efficiencies. One example of such a technique is the Burrows-Wheeler transform ("BWT"), where large blocks of input are rearranged in a sorted order. While BWT does improve compression efficiency, it does not replace symbol values, so it may not be as efficient on input streams with a wide variance in symbols, or streams where a large number of the symbols have high values.

Context models have been used in prediction by partial matching (PPM) coding techniques. However, adaptive entropy coders that use a prediction by partial matching context model use a lot of memory—the amount in use tends to grow exponentially with the size of contexts. Even a relatively short context of 3 characters can use tens or hundreds of megabytes of memory for context tables. Even worse, if the decompressor does not have enough memory available to construct all of the context tables, the compressed stream cannot be decompressed. Even worse than that, the decompressor may not know it cannot successfully process a compressed data stream until it runs out of memory.

BRIEF DESCRIPTION OF THE DRAWINGS

The present invention is illustrated by way of example and not limitation in the figures of the accompanying drawings in which like references indicate similar elements.

FIGS. 3-4 are data structures which may be used for encoding and decoding processes according to one embodiment of the invention.

FIGS. 6A-6L are data diagrams illustrating an encoding process according to one embodiment of the invention.

DETAILED DESCRIPTION

Figure 1:
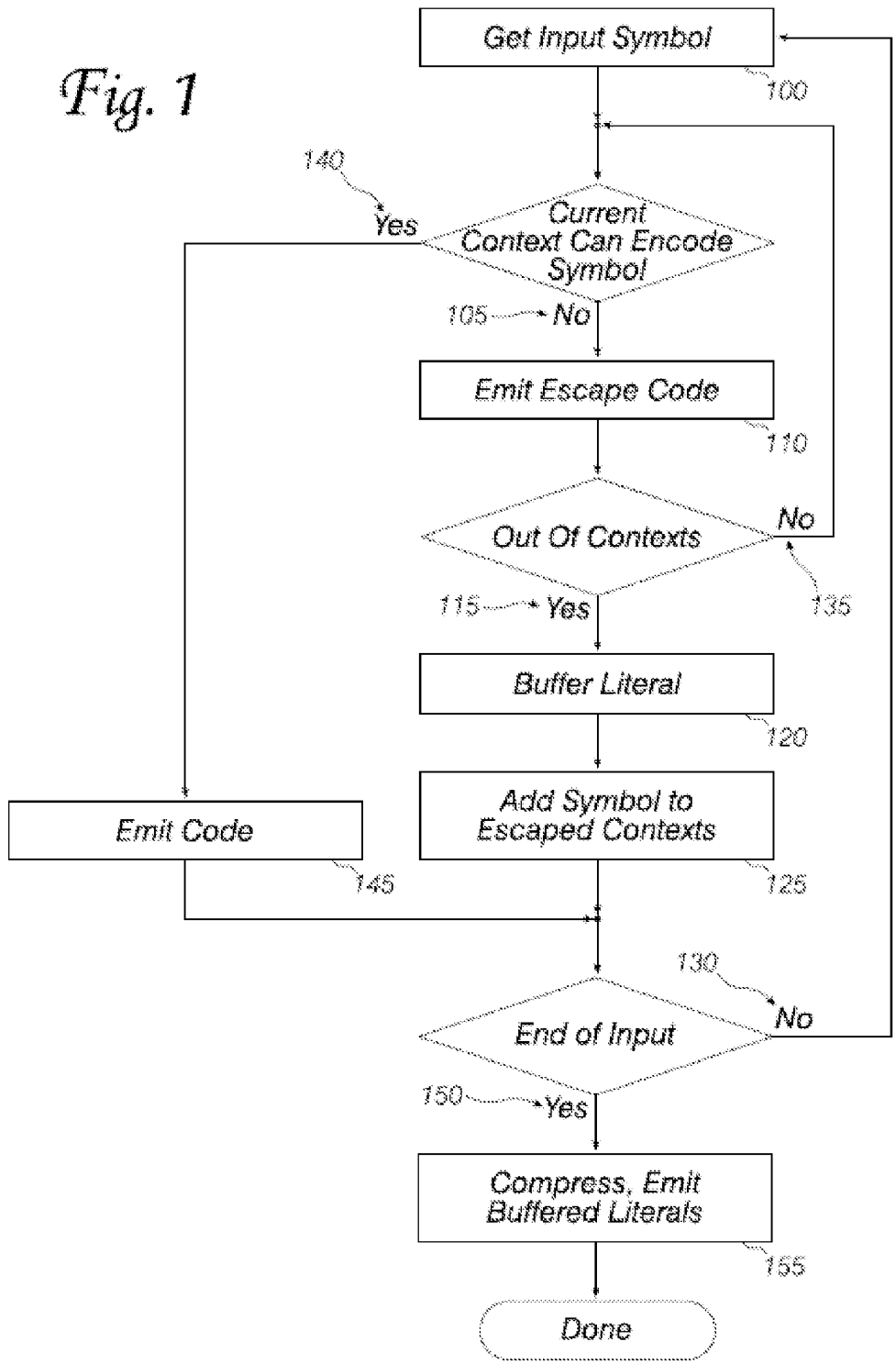
FIG. 1 shows an overview of an adaptive coding process according to an embodiment of the invention.

Techniques for memory management for PPM context models are described herein. In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

According to certain embodiments of the invention, a process is configured to keep track of some additional information to be able to intelligently prune the context tables whenever it makes sense to do so. In addition to the ordinary information tracked in each context table, each context table would also have a child pointer pointing to a child context table for each symbol encoded from the current context table and a counter associated with each symbol, where the counter represents a number of that particular symbols that have been coded. In addition, a global counter value is also maintained in each context table representing a total number of symbols that have been coded by the system as a whole at the point in time when the respective context is utilized. Further, a local counter value is maintained to represent a total number of symbols currently coded by that particular context.

Every time a context table is used to code something, the global counter value of that particular context is updated to a value representing a total number of symbols that have been coded by the system (e.g., context model) as a whole, and the local counter value is also incremented. This global counter, which represents a total number of symbols that have been coded by the system as a whole, could be an offset for the input stream. The context tables would be allocated as an array of context table objects at coder/decoder startup or initialization period. For example, a convenient number of context table objects can be used, or the size of this array can be a parameter of the coder. The objects would be initially in an unused state, and as more are needed, they could be initialized and passed to the PPM model. When the last context table object is used, the memory manager would iterate over the array, and deallocate "unimportant" or "less important" contexts.

For example, periodically or after certain conditions have been satisfied, the context tables are prioritized or sorted according to certain characteristics of the context tables, such as, for example, the global counter value and local counter value of each context able. A resource management process is then performed, for example, releasing system resources such as memory associated with certain context tables (also referred to context table objects or context data objects).

Figure 2:
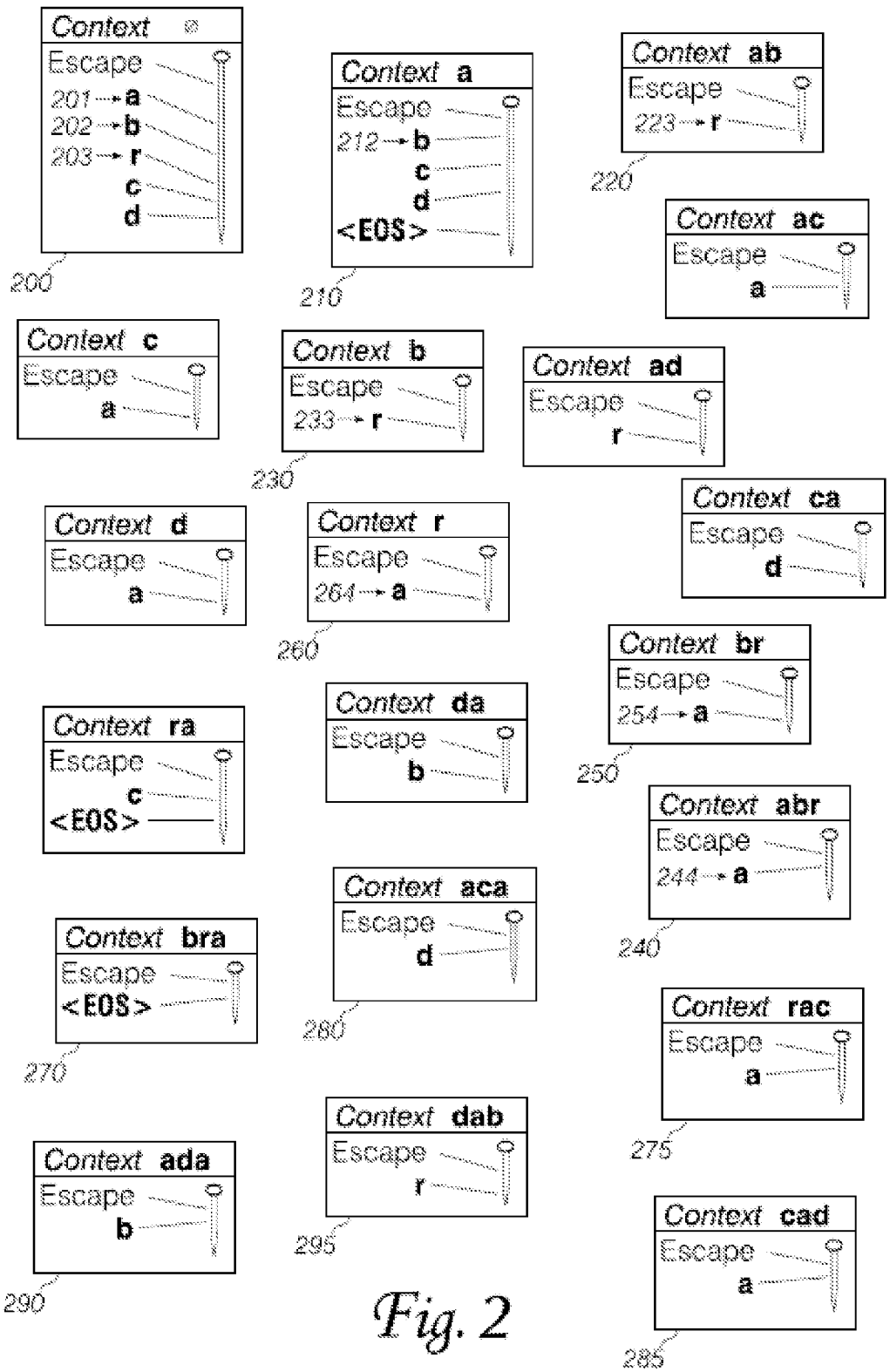
FIG. 2 shows the three-symbol contexts that are created as an embodiment of the invention compresses the string "abracadabra".

FIG. 1 is a flow diagram illustrating operations of an adaptive difference coder according to one embodiment of the invention. The following explanation will track the coder through the flow chart as it processes an input string, "abracadabra". Coding can be thought of as building a model of the input data and picking a minimal set of clues about the model to send to a decoder, so that the decoder can replicate the model and reproduce the input string. FIG. 2 shows "contexts" of the model according to certain embodiments of the invention. Each context corresponds to symbols the coder has recently encoded (or symbols the decoder has recently recovered). The coder examined in this example uses three-symbol contexts (i.e., each context corresponds to the up to three most-recently-encountered input symbols). Shorter contexts (two-character, one-character, and no-character contexts) also appear in the model, which may be a parent of a longer context (e.g., next order context) in a tree structure. All the contexts together make up a probability model that, in some sense, represents estimates of the likelihood that a particular symbol will be seen at a certain point in the input.

According to one embodiment, as an example of an implementation, each context may be defined as a data structure as shown in FIG. 3. Referring to FIG. 3, each context includes one or more child contexts (e.g., longer contexts or next order contexts), where number of the child contexts depends on a specific application or configuration. In this example, it is assumed that there are 256 different symbols plus an escape symbol. In addition, each context also includes a local counter for storing a local counter value representing a number of symbols coded by the current context. Furthermore, a global counter (not shown) is also globally maintained by the context model representing a total number of symbols that have been coded. Note that the data structure as shown in FIG. 3 is described for purposes of illustration only. Other formats or configurations may also exist.

Although all of the contexts, and the symbols each can encode, are shown in FIG. 2, they accumulate over time (as described below). The model starts out empty, with the initial context 200 (e.g., context " " as a root context) able to encode only an escape symbol. The escape symbol is distinct from the 256 possible symbols that could be present in a stream of eight-bit characters.

The coder retrieves the first input symbol (block 100), 'a' ("*a*bracadabra"). The current context, 200, cannot (yet) encode 'a' (block 105) so the coder emits an escape token (block 110) and moves to a shorter context. Since context 200 is the shortest (zero-character) context, the coder is out of contexts (block 115). It buffers the literal 'a' (120) and adds 'a' to each of the escaped contexts (block 125). (Element 201 indicates the 'a' added to context 200.) The coder has not reached the end of its input (block 130), so it loops back to get the next input symbol (block 100).

Figure 4:
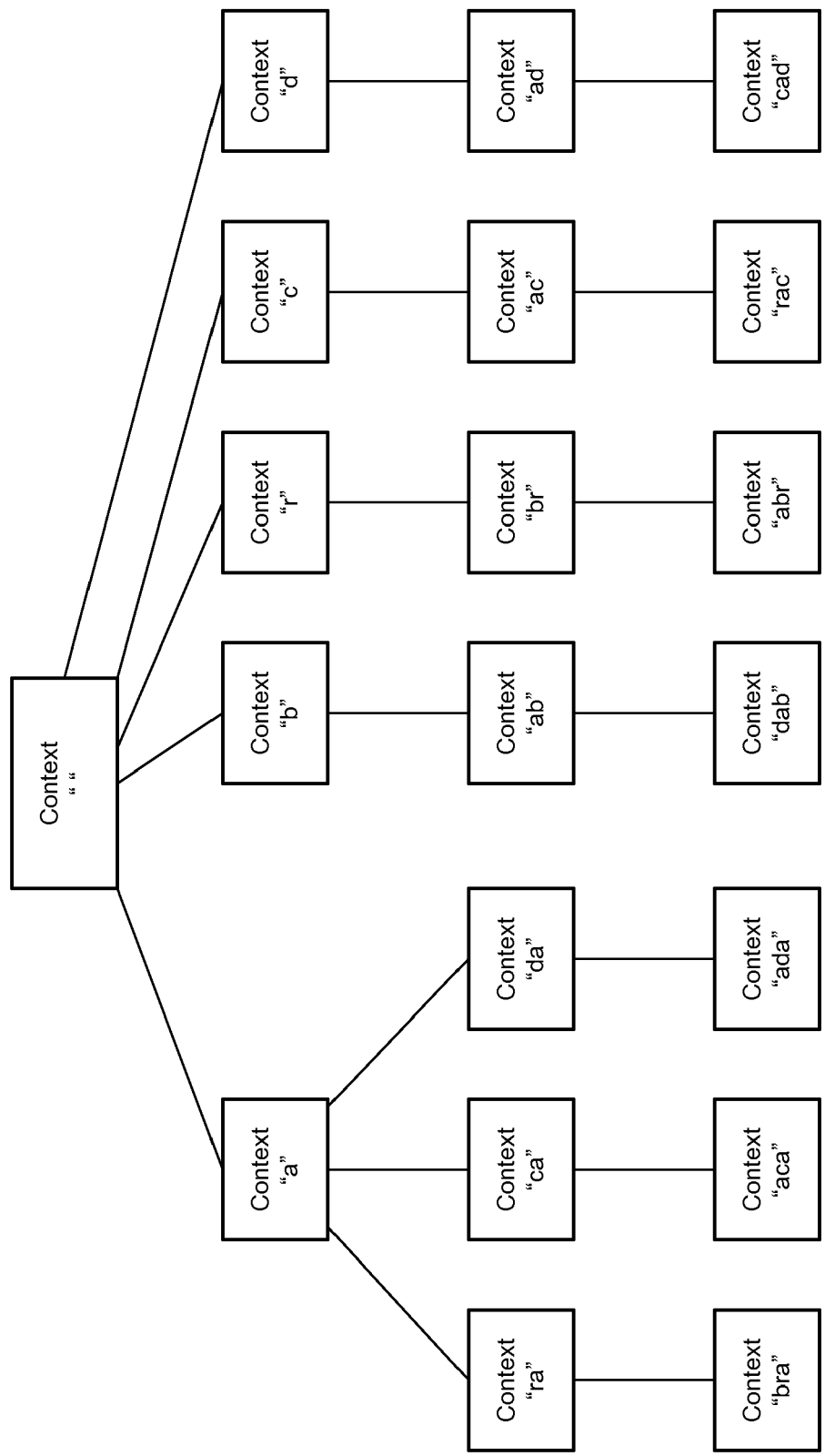

In practice, a child context is created having a parent pointer pointing to context 200 while context 200 has a child pointer pointing to the newly created child context, forming a tree structure similar to the one as shown in FIG. 4. In this example, context 210 (e.g., context "a") is created from context 200, where context "a" includes a parent pointer pointing to context 200 while context 200 includes a child pointer pointing to context "a", as shown in FIG. 4. At this point, context "a" can only encode an escape symbol, also referred to as "<Esc>" symbol, which may be considered implicit <Esc> symbol.

The next symbol is 'b' ("a*b*racadabra"), and the coder starts with the last context corresponding to the last symbol which is context "a" (block 210). Since context 210 cannot (yet) encode 'b' (block 105), the coder emits an escape token (block 110) and moves (e.g., escapes) to a shorter context, which is context 200 (e.g., the parent context of context "a") as shown in FIG. 4. The next-shortest context is 200, so the coder is not out of contexts (block 135) and loops back to consider context 200. Context 200 is also unable to encode 'b' (block 105) (it can currently encode only escape and 'a'), so the coder emits another escape token (block 110) and moves to a shorter context. Again, context 200 is the shortest context, so the coder is out of contexts (block 115). The literal, 'b', is buffered and also added to each escaped context (blocks 202, 212). So far, the coder has emitted three escapes and buffered two literals. Only the escape from context 200 on input symbol 'b' required any bits to encode; all the other escapes were from contexts that could only encode the escape.

The next symbol is 'r' ("ab*r*acadabra") and the starting context is "ab" (block 220), which corresponds to the last context with respect to "r" (e.g., for sequence of "abr" the last context having up to three symbols is context "ab"). Context 220 cannot encode 'r' (block 105), so the coder emits an escape token (block 110) and moves to shorter context 'b' (block 230) (e.g., parent context of context "b" as shown in FIG. 4). Context 230 also cannot encode r (block 105), so the coder emits another escape token (block 110) and moves to shorter context 200. Context 200 cannot encode 'r' (block 105), so the coder emits another escape token (block 110) but is out of contexts (block 115), which in turns creates a child context "r", etc. Literal 'r' is buffered and added to contexts 200, 220 and 230 (see 203, 223 and 233). The end of the input has still not been reached (block 130), so the coder loops back yet again.

For the next input symbol, 'a' ("abr*a*cadabra"), the coder starts at context 240 and escapes through 240, 250 and 260 (adding coding 244, 254 and 264) before discovering that context 200 can encode the input symbol (block 140). Therefore, the coder emits the appropriate code (block 145) and loops back again.

The following table summarizes the activity of the coder working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the coder buffered a literal and updated one or more escaped-from contexts.

TABLE 1

| Symbol | Start Context | Escapes | Coding Context | Literal |
|---|---|---|---|---|
| a | 200 Ø | 1 | | a |
| b | 210 a | 2 | | b |
| r | 220 ab | 3 | | r |
| a | 240 abr | 3 | 200 | |
| c | 270 bra | 4 | | c |
| a | 275 rac | 3 | 200 | |
| d | 280 aca | 4 | | d |
| a | 285 cad | 3 | 200 | |
| b | 290 ada | 3 | 200 | |
| r | 295 dab | 3 | 200 | |
| a | 240 abr | | 240 | |
| <EOS> | 270 bra | 4 | | <EOS> |

After escaping from context 270 and buffering the end-of-stream (EOS) literal, the coder determines that the end of input has been reached (block 150). Now, it compresses the buffered literals and emits them in a discernible position relative to the encoded data bits (for example, at the beginning of the encoded stream, at the end of the stream, or at a block boundary in the stream). Concerns affecting the placement of the buffered, compressed literals are discussed below.

Figure 5:
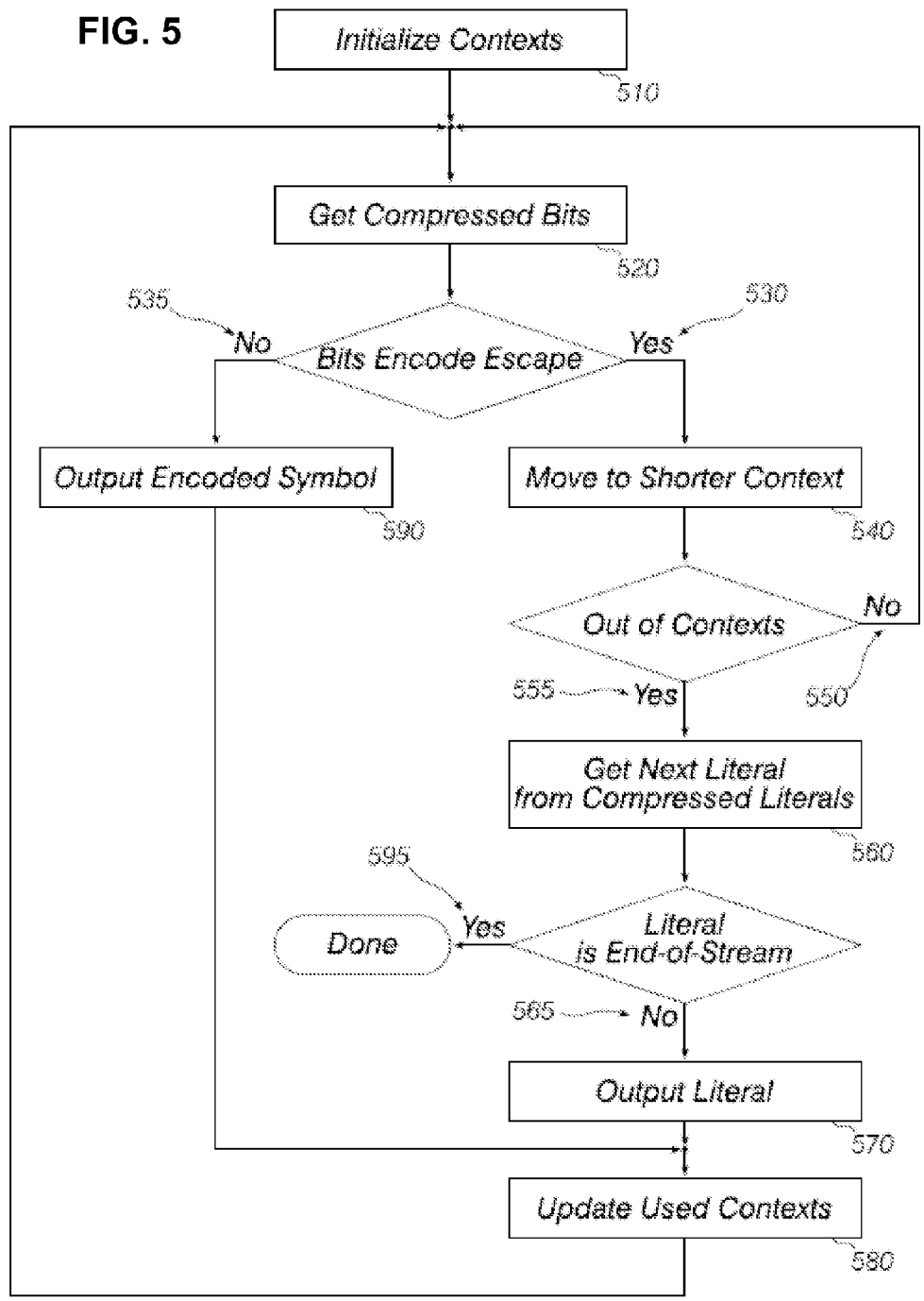
FIG. 5 is a flow diagram outlining decoding according to an embodiment of the invention.

FIG. 5 is a flow diagram outlining the operations of an adaptive data decoder according to an embodiment of the invention. Referring to FIG. 5, the decoder initializes its context model identically to the coder's initialized model (block 510). Recall that despite the large number of contexts (shown in FIG. 2) that exist after compressing an input stream, the coder and decoder start with just one context, 200, that can encode just one symbol, escape.

Next, the decoder gets some compressed bits from the compressed data stream. The number of compressed bits necessary to decide what to do next varies from time to time, depending on the state of the decoding context. For example, when decoding has just started and context 200 can only encode escape, no bits are required—the decoder knows that the coder must have emitted an escape, because that is the only thing it could emit. Consequently, the escape is encoded in zero bits.

Since the first compressed bits encode escape (block 530), the decoder moves to a shorter context (block 540). However, since context 200 is already the shortest context, the decoder is out of contexts (block 555) and requires a literal. It obtains the next literal from the literal decoder (block 560), checks to ensure that it has not reached the end-of-stream (block 565) and outputs the literal as the reconstituted data (block 570). Referring to Table 1, it is clear that the first compressed literal was a, so that symbol is output.

Any contexts used (e.g., escaped from) are updated (block 580), and the decoder loops back to get more compressed bits (block 520). (Again, no compressed bits have been used yet, because no existing context could encode anything except Escape.)

Now, the decoder is in context 210, because it has just produced the symbol 'a'. Context 210 is unable to encode any symbol except escape, so the decoder again consumes zero bits to determine that the next encoded symbol is escape (block 530). Now, the decoder moves to the next-shorter context (block 540), which is context 200. It is not out of contexts (block 550), so it loops back to get more compressed bits (block 520).

Context 200 currently encodes escape and 'a', so some information (at least a portion of a compressed bit) is required to decide which. This compressed bit encodes another escape (block 530). This is the third escape mentioned above. The decoder moves to a shorter context (block 540) and runs out of contexts (555), so it gets the next literal from the compressed literals (block 560), notes that it is not end-of-stream (block 565), and outputs it (block 570). Recall that the second literal produced during coding was 'b'. The contexts escaped from (210, 200) are updated (block 580) and the decoder loops back again.

This process continues until the characters 'abr' have been recovered and output. The decoder is in state 240 and gets some more compressed bits (block 520). States 240, 250 and 260 only encode escapes, so no bits are consumed as the decoder escapes to shorter contexts. When it reaches context 240, it discovers that the next compressed bits encode 'a' (block 535), so it outputs this symbol (block 590), updates the appropriate contexts (580) and loops back to process more compressed bits.

The decoder continues working through the compressed bits, extracting literals as necessary from the compressed literals block, until there are no more compressed bits to examine. At this point, the original input symbol sequence has been reconstituted and emitted.

Note that the decoding process requires literals from the compressed block fairly early in its operations (in fact, the very first thing it does is infer an escape from zero compressed bits, extract a compressed literal and output it). Thus, it is important for the decoder to have access to the compressed literals as soon as possible. If the decoder has access to the entire compressed data stream, then it can use the dual-file-pointer method depicted to access the literals as necessary. However, if the decoder is receiving the compressed data stream from a non-seekable source, it must buffer the data until it can determine where the compressed literals are. Further detailed information regarding the techniques set forth above can be found in a co-pending U.S. patent application Ser. No. 11/948,954, filed Nov. 30, 2007, which is incorporated by reference herein.

Note that the above coding techniques are described for illustration purposes only. A variety of different approaches may also be implemented, for example, those as described in co-pending U.S. patent application Ser. No. 12/072,879 filed Feb. 27, 2008; Ser. No. 12/072,811 filed Feb. 27, 2008; Ser. No. 12/072,760, filed Feb. 27, 2008; and Ser. No. 12/100,847, filed Feb. 27, 2008, which are incorporated by references herein.

According to certain embodiments of the invention, a process is configured to keep track of some additional information to be able to intelligently prune the context tables whenever it makes sense to do so. In addition to the ordinary information tracked in each context table, each context table would also have a child pointer pointing to a child context table for each symbol encoded from the current context table and a counter associated with each symbol, where the counter represents a number of that particular symbols that have been coded. In addition, a global counter value is also maintained in each context table representing a total number of symbols that have been coded by the system as a whole at the point in time when the respective context is utilized. Further, a local counter value is maintained to represent a total number of symbols currently coded by that particular context.

Every time a context table is used to code something, the global counter value of that particular context is updated to a value representing a total number of symbols that have been coded by the system (e.g., context model) as a whole, and the local counter value is also incremented. This global counter, which represents a total number of symbols that have been coded by the system as a whole, could be an offset for the input stream. The context tables would be allocated as an array of context table objects at coder/decoder startup or initialization period. For example, a convenient number of context table objects can be used, or the size of this array can be a parameter of the coder. The objects would be initially in an unused state, and as more are needed, they could be initialized and passed to the PPM model. When the last context table object is used, the memory manager would iterate over the array, and deallocate "unimportant" or "less important" contexts.

For example, periodically or after certain conditions have been satisfied, the context tables are prioritized or sorted according to certain characteristics of the context tables, such as, for example, the global counter value and local counter value of each context able. A resource management process is then performed, for example, releasing system resources such as memory associated with certain context tables (also referred to context table objects or context data objects).

According to one embodiment, rules for this memory deallocation process can be that the order 0 context cannot be deallocated. The remaining contexts are sorted based on a mathematical representation such as a sum of the two counters (highest values first), starting with the lowest counter sums first, iterate over the contexts, removing them from the context model until "enough" objects have been returned to the unused state. If a context object that is being removed from the model has active child contexts (for example, when removing the "ab" context, and the "abc" context exists), remove the child contexts as well.

To simplify the process that provides context objects to the PPM model, the unused context objects may be initialized into a linked list, and processing logic then walks the list to provide new objects. Also, it may be simpler if the context object recovery process runs every time the number of available context objects drops below the maximum context length. In that way, a user does not have to worry about running out of context objects in the middle of coding an input byte. The value of "enough" for the contexts that should be removed is going to be somewhat implementation dependent as part of a predetermined threshold. Removing half of them will provide a lot of free objects, which means the object freeing process would not be run as often. However, removing half of the model may seriously impact compression performance. One quarter or one third may be good compromises. Various configurations may be implemented herein.

FIGS. 6A-6Q are diagrams illustrating an encoding process using counting according to one embodiment of the invention. In this example, a context model having multiple context tables is utilized using the sequence of "abracadabraabrac" as an example. A context table may be implemented using a data structure similar to the one shown in FIG. 3.

According to one embodiment, this technique allows a user to recover memory for reuse by getting rid of (e.g., releasing or deallocating) contexts that have not been used recently, while also preserving contexts that are heavily used, but not recently. For an ordinary PPM context table, there is a current context (a string, representing what has been seen recently—for example, coding the first four letters of "abracadabra" will create the contexts "a", "b", and "r", and possibly "ab", "br", "ra", "abr", "bra", and "abra", depending on the precise details of the model). A table of pointers to child contexts (the "ab" context from the example above would have a pointer to the "abr" context), and an associated table of counts (the "ab" context would have a count of 1 for the "abr" context).

In addition to child context counts, according to one embodiment, each context would have its own local counter value representing a number of symbols encoded by the current context. Either or both of the local and global counter values can be maintained with the context node itself. For the purpose of illustration, each context table maintains a local counter value and a global counter value representing a total number of symbols that have been coded at the point in time.

For purpose of illustration, an order-2 PPM model is used as an example herein as shown in FIGS. 6A-6L. According to one embodiment, the model would start with a degenerate " " context. This context only contains a count for the escape code (used to code literal characters), as shown in FIG. 6A. When the 'a' here→"*a*bracadabra" gets coded, the " " context is updated to include an 'a' entry with a count of 1. The "a" context is then created with some count value for the escape code, and its context global count value set to the global counter value (1, at this point). The "next context" pointer for the escape code in the "a" context points to the " " context, as shown in FIG. 6B. At this point, the global counter value is 1 while the local counter value of "a" is 1 as well since there is only one symbol (<Esc>) coded therein.

When the 'b' here→"a*b*racadabra" gets coded, the " " and "a" contexts are updated to include a 'b' entry, each with a count of 1. The 'b' entry in the " " context points to the "b" context, and the 'b' entry of the "a" context points to the "ab" context. The "b" and "ab" contexts are also created, each with an escape code with some count value, and a "next context" pointer for the escape code pointing at the " " and "b" contexts, respectively. Both the "b" and "ab" context nodes get context global count values set to the current global counter value to 2. The "a" context was updated to add a 'b' entry, so it also has its context global counter value updated, as shown in FIG. 6C. That is, every time when a context is used to code a symbol, the local counter value is updated based on a number of symbols coded by the respective context. In addition, its own copy of the global counter value is also updated by setting the global counter value to a value representing a total number of symbols that have been currently coded.

Continuing with the 'r' here→"ab*r*acadabra", both the "b" and the "ab" contexts get updated to include an 'r' entry, and the contexts "r" and "br" all get created. All of the nodes "b", "ab", "r", and "br" get the current global count value of 3, as shown in FIG. 6D. Similarly, after coding 'a' here→"abr*a*cadabra", the context tables are updated as shown in FIG. 6E. After coding 'c' here→"abra*c*adabra", the context tables are updated as shown in FIG. 6F. After coding 'a' here→"abrac*a*dabra", the context tables are updated as shown in FIG. 6G. After coding 'd' here→"abraca*d*abra", the context tables are updated as shown in FIG. 6H. After coding 'a' here→"abracad*a*bra", the context tables are updated as shown in FIG. 6I. After coding 'b' here→"abracada*b*ra", the context tables are updated as shown in FIG. 6J. After coding 'r' here→"abracadab*r*a", the context tables are updated as shown in FIG. 6K. After coding 'a' here→"abracadabr*a*", the context tables are updated as shown in FIG. 6L. Note that the last two characters 'r' and 'a' can be directly coded from "ab" and "br" contexts respectively.

Thus, when all of the symbols of "abracadabra" have been coded, if the coder needed to free some context tables to make more memory available, it would start by sorting the tables in order by the sum of their global count value and their local count value, where the global count value and the local count value are maintained in their respective context tables. In this example, the contexts and their associated sums are:

"a"—13 (9+4)
"b"—4 (3+1)
"ab"—12 (10+2)
"r"—5 (4+1)
"br"—5 (4+1)
"ra"—6 (5+1)
"c"—7 (6+1)
"ac"—7 (6+1)
"ca"—8 (7+1)
"d"—9 (8+1)
"ad"—9 (8+1)
"da"—10 (9+1)

Once the weight for each context is calculated, the contexts are ordered by position in the table (last first), then by length (shortest first), and then by this weighting (highest first):

"a"
"d"
"c"
"r"
"b"
"ab"
"da"
"ad"
"ca"
"ac"
"ra"
"br"

Sorting by length and then by weighting means certain items can be removed from the end of the list without having to worry about invalidating references to predecessor contexts. Sorting by creation time (most recent first) is easy to accomplish if the context structures are managed on a linked list—each context would just have a pointer to the context that was created just before it. If the context structures are managed in a table, this may require moving a majority of the context structures every time the coder needs to deallocate some context structures.

An alternate approach is to include the counts of all of the child nodes of a particular node, and use that as the weighting. Calculating all of these weights can be done by a recursive process that visits each node only once, and has a maximum recursive depth equal to the longest context in the table. For the example of "abracadabra", the adjusted weights become:
"a"—72
"b"—15
"ab"—25
"r"—18
"br"—11
"ra"—13
"c"—24
"ac"—15
"d"—30
"ad"—19
"da"—21

Using the same sorting rules, this results in the ordering:
"a"
"d"
"c"
"r"
"b"
"ab"
"da"
"ad"
"ca"
"ac"
"ra"
"br"

Note that a coder needs some way to communicate when it deallocates context tables. The simplest way is to implicitly communicate this information by design. That is, the coder allocates a fixed number of context table structures from the operating system when it starts up, and runs a cleanup function whenever it runs out of preallocated context tables.

Figure 7:
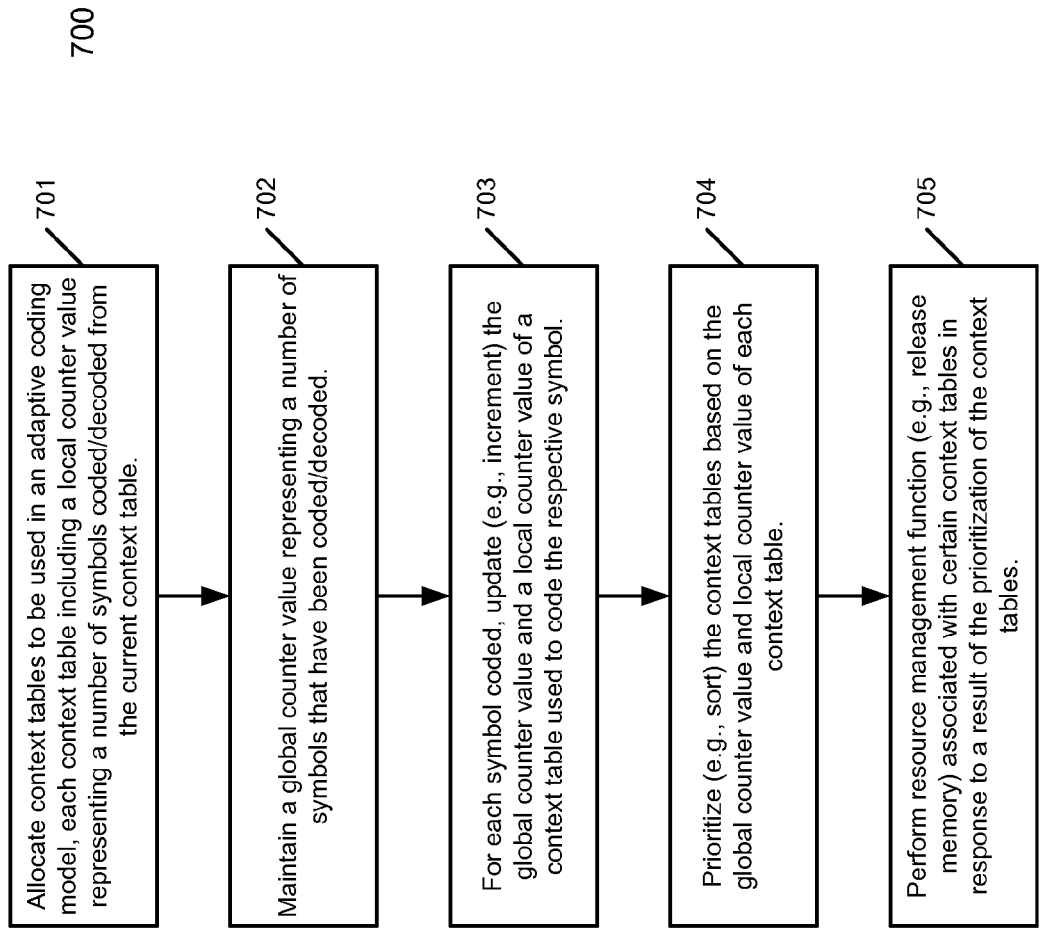
FIG. 7 is a flow diagram illustrating a process for memory management for adaptive PPM context model according to one embodiment of the invention.

Slightly more flexibly, the coder can prepend the output stream with a count of the maximum number of context tables it will use. The most flexible way, however is to have a special code that indicates that the coder is pruning the context tables. This would probably be coded using the order-1 context (the same context that's used to code all of the literals—the coder would emit escapes all the way back to the " " context, and then escape from that context). The number of contexts that are removed during this pruning operation could either be implicit (say, always remove half of the nodes), or the coder could emit the number of contexts it is removing. FIG. 7 is a flow diagram illustrating the techniques described above in view of FIGS. 6A-6L according to certain embodiments of the invention.

Note that the "local count" value is always equal to the sum of all of the code entries in the table including the escape code. This sum may be maintained by the PPM model anyways (e.g., it is necessary to calculate predictions from the model). Thus, the only explicit additional data that is being added to the model is the global counter value. When the last characters are coded, the order 1 context tables do not get updated, since the characters can be coded from the order two contexts. Note that the above processes may be performed by processing logic which may include software, hardware, or a combination of both.

Figure 8:
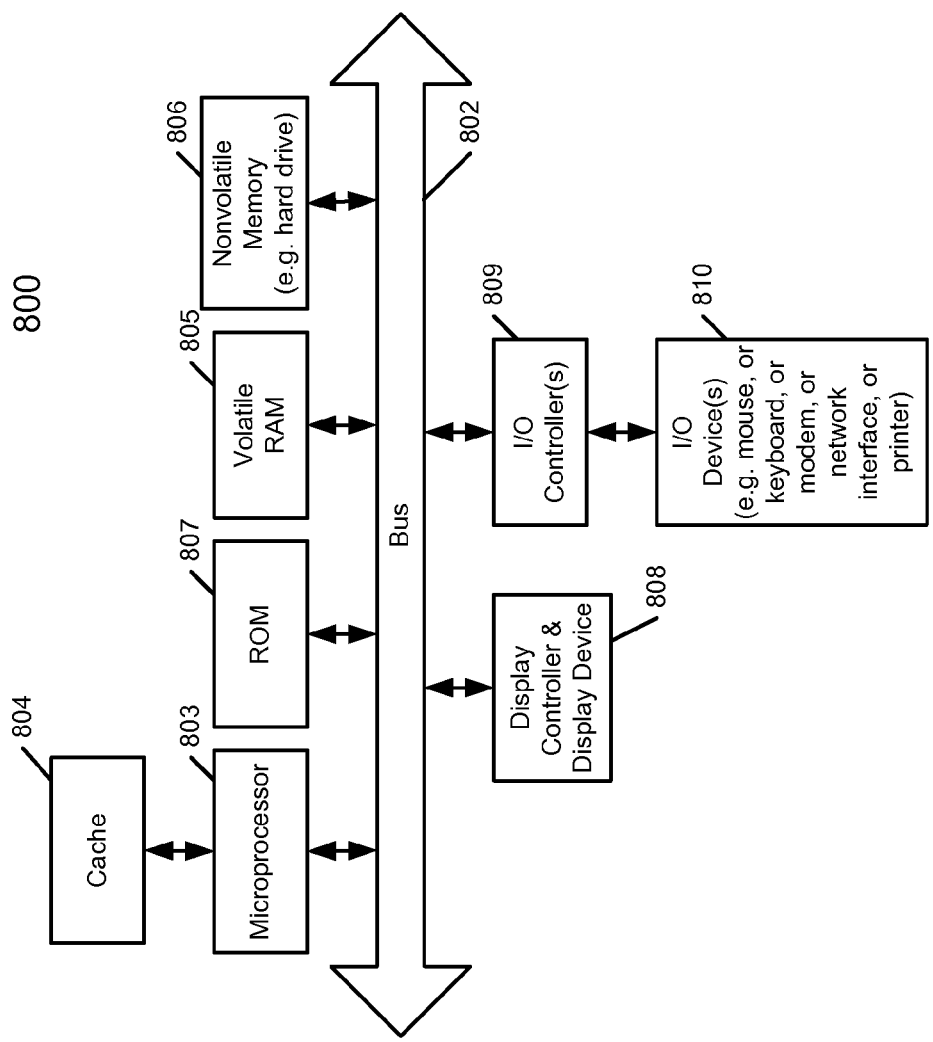
FIG. 8 is a block diagram illustrating an example of a data process system which may be used with one embodiment of the invention.

FIG. 8 illustrates a diagrammatic representation of a machine in the exemplary form of a computer system within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. For example, the system 800 may be used as part of system, either an coder or a decoder, to perform the coding processes set forth above, as well as memory management processes.

As shown in FIG. 8, the system 800, which is a form of a data processing system, includes a bus or interconnect 802 which is coupled to one or more microprocessors 803 and a ROM 807, a volatile RAM 805, and a non-volatile memory 806. The microprocessor 803 is coupled to cache memory 804 as shown in the example of FIG. 8. Processor 803 may be, for example, a PowerPC microprocessor or an Intel compatible processor. Alternatively, processor 803 may be a digital signal processor or processing unit of any type of architecture, such as an ASIC (Application-Specific Integrated Circuit), a CISC (Complex Instruction Set Computing), RISC (Reduced Instruction Set Computing), VLIW (Very Long Instruction Word), or hybrid architecture, although any appropriate processor may be used.

The bus 802 interconnects these various components together and also interconnects these components 803, 807, 805, and 806 to a display controller and display device 808, as well as to input/output (I/O) devices 810, which may be mice, keyboards, modems, network interfaces, printers, and other devices which are well-known in the art.

Typically, the input/output devices 810 are coupled to the system through input/output controllers 809. The volatile RAM 805 is typically implemented as dynamic RAM (DRAM) which requires power continuously in order to refresh or maintain the data in the memory. The non-volatile memory 806 is typically a magnetic hard drive, a magnetic optical drive, an optical drive, or a DVD RAM or other type of memory system which maintains data even after power is removed from the system. Typically, the non-volatile memory will also be a random access memory, although this is not required.

While FIG. 8 shows that the non-volatile memory is a local device coupled directly to the rest of the components in the data processing system, embodiments of the present invention may utilize a non-volatile memory which is remote from the system; such as, a network storage device which is coupled to the data processing system through a network interface such as a modem or Ethernet interface. The bus 802 may include one or more buses connected to each other through various bridges, controllers, and/or adapters, as is well-known in the art. In one embodiment, the I/O controller 809 includes a USB (Universal Serial Bus) adapter for controlling USB peripherals. Alternatively, I/O controller 809 may include an IEEE-1194 adapter, also known as FireWire adapter, for controlling FireWire devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A computer implemented method for resource management in a PPM (prediction by partial matching) context model, the method comprising:
in response to an input stream having a sequence of symbols to be coded, allocating a plurality of contexts, each context including a plurality of entries, wherein each entry represents a symbol that a current context is able to code, including a counter value representing a frequency of each entry being used;
for each symbol coded by a context, maintaining within a respective context a local counter value representing a number of symbols that have been coded by the respective context and a global counter value representing a total number of symbols that have been coded by the PPM context model as a whole at a point in time when the respective context is used to code a symbol;
determining whether a resource management operation is required based on system resource utilization by the PPM context model; and
if it is determined that the resource management operation is required, performing by a processor, the resource management operation for system resources associated with the plurality of contexts based on the global counter value and the local counter value associated with each of the plurality of contexts.

2. The method of claim 1, further comprising sorting the plurality of contexts based on a mathematical representation of the global counter value and the local counter value of each context, wherein the resource management operation is performed on contexts having mathematical representations of global counter values and local counter values that satisfy a predetermined condition.

3. The method of claim 2, wherein the mathematical representation represents a sum of the global counter value and the local counter value of each context, wherein the resource management operation is performed on a context when the sum of the associated global counter value and local counter value exceeds a predetermined threshold.

4. The method of claim 3, wherein the resource management operation comprises releasing system resources associated with a context.

5. The method of claim 3, wherein the contexts are sorted by orders of the PPM context model and the contexts within the same order are sorted according to a weight factor represented by the sum of the global counter value and the local counter value of each context.

6. The method of claim 5, wherein resource management operation is performed on a context having a lower order and a lower weight factor first.

7. The method of claim 6, wherein each context further comprises a pointer pointing to a child context associated with each symbol coded by the current context, and wherein performing the resource management operation comprises iterating through the contexts via pointers pointing to the child contexts.

8. The method of claim 1, wherein determining whether a resource management operation is required comprises one of allocating a predetermined number of context tables, coding a predetermined number of input symbols, and using a predetermined amount of system memory.

9. A computer readable medium including instructions that, when executed by a processor, cause the processor to perform a method for resource management in a PPM (prediction by partial matching) context model, the method comprising:
in response to an input stream having a sequence of symbols to be coded, allocating a plurality of contexts, each context including a plurality of entries, wherein each entry represents a symbol that a current context is able to code, including a counter value representing a frequency of each entry being used;

for each symbol coded by a context, maintaining within a respective context a local counter value representing a number of symbols that have been coded by the respective context and a global counter value representing a total number of symbols that have been coded by the PPM context model as a whole at the point in time when the respective context is used to code a symbol;

determining whether a resource management operation is required based on system resource utilization by the PPM context model; and if it is determined that the resource management operation is required, performing by the processor, the resource management operation for system resources associated with the plurality of contexts based on the global counter value and the local counter value associated with each of the plurality of contexts.

10. The computer readable medium of claim 9, wherein the method further comprises sorting the plurality of contexts based on a mathematical representation of the global counter value and the local counter value of each context, wherein the resource management operation is performed on contexts having mathematical representations of global counter values and local counter values that satisfy a predetermined condition.

11. The computer readable medium of claim 10, wherein the mathematical representation represents a sum of the global counter value and the local counter value of each context, wherein the resource management operation is performed on a context when the sum of the associated global counter value and local counter value exceeds a predetermined threshold.

12. The computer readable medium of claim 11, wherein the resource management operation comprises releasing system resources associated with a context.

13. The computer readable medium of claim 11, wherein the contexts are sorted by orders of the PPM context model and the contexts within the same order are sorted according to a weight factor represented by the sum of the global counter value and the local counter value of each context.

14. The computer readable medium of claim 13, wherein resource management operation is performed on a context having a lower order and a lower weight factor first.

15. The computer readable medium of claim 14, wherein each context further comprises a pointer pointing to a child context associated with each symbol coded by the current context, and wherein performing the resource management operation comprises iterating through the contexts via pointers pointing to the child contexts.

16. The computer readable medium of claim 9, wherein determining whether a resource management operation is required comprises one of allocating a predetermined number of context tables, coding a predetermined number of input symbols, and using a predetermined amount of system memory.

17. A data processing system, comprising:
a processor; and
a memory for storing instructions, which when executed from the memory, cause the processor to in response to an input stream having a sequence of symbols to be coded, allocate a plurality of contexts, each context including a plurality of entries, wherein each entry represents a symbol that a current context is able to code, including a counter value representing a frequency of each entry being used, for each symbol coded by a context, maintain within a respective context a local counter value representing a number of symbols that have been coded by the respective context and a global counter value representing a total number of symbols that have been coded by the PPM context model as a whole at a point in time when the respective context is used to code a symbol, determine whether a resource management operation is required based on system resource utilization by the PPM context model, and if it is determined that the resource management operation is required, perform the resource management operation for system resources associated with the plurality of contexts based on the global counter value and the local counter value associated with each of the plurality of contexts.

18. The system of claim 17, wherein the plurality of contexts is sorted based on a mathematical representation of the global counter value and the local counter value of each context, wherein the resource management operation is performed on contexts having mathematical representations of global counter values and local counter values that satisfy a predetermined condition.

19. The system of claim 18, wherein the mathematical representation represents a sum of the global counter value and the local counter value of each context, wherein the resource management operation is performed on a context when the sum of the associated global counter value and local counter value exceeds a predetermined threshold.

20. The system of claim 19, wherein the resource management operation comprises releasing system resources associated with a context.

21. The system of claim 19, wherein the contexts are sorted by orders of the PPM context model and the contexts within the same order are sorted according to a weight factor represented by the sum of the global counter value and the local counter value of each context.

22. The system of claim 21, wherein resource management operation is performed on a context having a lower order and a lower weight factor first.

23. The system of claim 22, wherein each context further comprises a pointer pointing to a child context associated with each symbol coded by the current context, and wherein performing the resource management operation comprises iterating through the contexts via pointers pointing to the child contexts.

24. The system of claim 17, wherein determining whether a resource management operation is required comprises one of allocating a predetermined number of context tables, coding a predetermined number of input symbols, and using a predetermined amount of system memory.

* * * * *